(12) United States Patent
Allamsetty

(10) Patent No.: US 6,618,686 B2
(45) Date of Patent: *Sep. 9, 2003

(54) SYSTEM AND METHOD FOR TESTING A CIRCUIT IMPLEMENTED ON A PROGRAMMABLE LOGIC DEVICE

(75) Inventor: Chakravarthy K. Allamsetty, Milpitas, CA (US)

(73) Assignee: Xilinx, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,628

(22) Filed: May 14, 1999

(65) Prior Publication Data

US 2003/0078752 A1 Apr. 24, 2003

(51) Int. Cl.[7] .................... G01R 27/28; G01R 31/00
(52) U.S. Cl. ....................................... 702/120
(58) Field of Search ............... 702/120, 117; 716/4, 16; 324/755, 73.1, 763, 142, 74, 754

(56) References Cited

U.S. PATENT DOCUMENTS

| 5,331,571 | A | * | 7/1994 | Aronoff et al. ............... 716/4 |
|---|---|---|---|---|
| 5,621,312 | A | * | 4/1997 | Anchor et al. ............ 324/158.1 |
| 5,706,294 | A | * | 1/1998 | Takahashi et al. ........... 714/724 |
| 5,740,086 | A | * | 4/1998 | Komoto ...................... 702/120 |
| 5,751,163 | A | * | 5/1998 | Tang et al. .................... 326/38 |
| 5,884,236 | A | * | 3/1999 | Ito ............................. 702/89 |
| 5,940,783 | A | * | 8/1999 | Kukutso et al. ............. 702/120 |
| 6,102,963 | A | * | 8/2000 | Agrawal ....................... 716/17 |
| 6,134,707 | A | * | 10/2000 | Hermann et al. ............ 717/139 |
| 6,154,715 | A | * | 11/2000 | Dinteman et al. ........... 702/120 |
| 6,182,247 | B1 | * | 1/2001 | Herrmann et al. ............ 714/39 |
| 6,323,679 | B1 | * | 11/2001 | Robertson et al. ............ 326/39 |

OTHER PUBLICATIONS

The Programmable Logic Data Book, published 1998 by Xilinx, Inc.

* cited by examiner

Primary Examiner—John Barlow
Assistant Examiner—Demetrius Pretlow
(74) Attorney, Agent, or Firm—Leroy D. Maunu; Michael R. Casey; Edel M. Young

(57) ABSTRACT

A system and method for testing a circuit implemented on a programmable logic device. A host processor is coupled to the programmable logic device via an interface device, which has a plurality of signal pins for configuring the programmable logic device. Selected pins of the interface device are connected to selected input pins of the programmable logic device. Test vectors from the host processor are applied to the selected input pins of the programmable logic device via the interface device, and the states of one or more signals appearing on one or more output pins of the device are analyzed.

16 Claims, 7 Drawing Sheets

SYSTEM AND METHOD FOR TESTING A CIRCUIT IMPLEMENTED ON A PROGRAMMABLE LOGIC DEVICE

CROSS-REFERENCES TO RELATED APPLICATIONS

This application relates to the following commonly owned U.S. Patent Applications, all filed on the same day as this application, and all incorporated herein by reference:

Ser. No. 09/312,316, entitled "METHOD FOR RESETTING AN FPGA INTERFACE DEVICE" invented by Conrad A. Theron and Donald H. St. Pierre, Jr., Ser. No. 09/312,282, entitled "EMBEDDING FIRMWARE FOR A MICROPROCESSOR WITH CONFIGURATION DATA FOR A FIELD PROGRAMMABLE GATE ARRAY" invented by Edwin W. Resler, Conrad A. Theron, Donald H. St. Pierre, Jr., and Carl H. Carmichael, Ser. No. 09/311,627, entitled "METHOD FOR RECONFIGURING A FIELD PROGRAMMABLE GATE ARRAY FROM A HOST" invented by Carl H. Carmichael, Conrad A. Theron, and Donald H. St. Pierre, Jr., Ser. No. 09/312,022, entitled "METHOD FOR CHANGING EXECUTION CODE FOR A MICROCONTROLLER ON AN FPGA INTERFACE DEVICE" invented by Conrad A. Theron, and Donald H. St. Pierre, Jr., Ser. No. 09/312,001, entitled "METHOD FOR DETECTING LOW POWER ON AN FPGA INTERFACE DEVICE" invented by Conrad A. Theron, Edwin W. Resler, and Donald H. St. Pierre, Jr., Ser. No. 09/312,023, entitled "METHOD FOR LEVEL SHIFTING LOGIC SIGNAL VOLTAGE LEVELS" invented by Donald H. St. Pierre, Jr., and Conrad A. Theron, and Ser. No. 09/312,035, entitled "METHOD OF DISGUISING A USB PORT CONNECTION" invented by Donald H. St. Pierre, Jr. and Conrad A. Theron, and Ser. No. 09/312,024, entitled "SYSTEM AND METHOD FOR READING DATA FROM A PROGRAMMABLE LOGIC DEVICE" invented by Thach-Kinh Le, Chakravarthy K. Allamsetty, Carl H. Carmichael, Arun K. Mandhania, Donald H. St. Pierre, Jr. and Conrad A. Theron.

FIELD OF THE INVENTION

The present invention generally relates to testing circuits implemented on programmable logic devices, and more particularly to providing input signals to a programmable logic device for testing operation of a circuit implemented thereon.

BACKGROUND

Field programmable gate arrays (FPGAs), first introduced by XILINX in 1985, are becoming increasingly popular devices for use in electronics systems. For example, communications systems frequently employ FPGAs for their re-programmability. In general, the use of FPGAs continues to grow at a rapid rate because FPGAs permit relatively short design cycles, reduce costs through logic consolidation, and offer flexibility through re-programmability. The capabilities of and specifications for XILINX FPGAs are set forth in "The Programmable Logic Data Book," published in 1998 by XILINX, Inc., the contents of which is incorporated herein by reference.

Where once a typical FPGA design comprised perhaps 5,000 gates, FPGA designs with 50,000 gates are now common, and FPGAs supporting 300,000 to 1,000,000 gates are available. New challenges for testing and debugging designs implemented on the devices have accompanied the growth in PLDs, particularly FPGAs. For example, large configuration bitstreams must be manipulated to test the PLDs. Thus, additional off-PLD storage and increased programming time are undesirable side effects of the growing size of configuration bitstreams.

In a test sequence that is presently used for designs implemented on PLDs, the configuration bitstream is downloaded to the device, selected input signals are provided to the device while advancing the device clock at selected times, and the state of the device is read back after having advanced the clock and provided the input signals. The state data can then be compared to expected state data to verify proper operation of the design.

In some PLDs, the data read back from the PLD correspond by position to the configuration bitstream downloaded to the PLD. In other PLDs, the configuration bitstream includes commands to replicate portions of the bitstream, so the data read back from the PLD includes more bits than the original bitstream. In either case, bits in the configuration bitstream that were used to program resources such as lookup tables, multiplexers, and signal line connections, and to initialize storage elements such as flip-flops, correspond to data read back from the PLD. The bitstream read back from a PLD includes two kinds of data: (1) the configuration data for determining the configuration of the PLD, which can be verified immediately after the configuration has been loaded into the PLD, and (2) state information stored in the storage elements in the PLD. The state of storage elements may change in running the test even though the states of bits used to program the programmable resources probably remain the same. Thus it may be desirable to repeatedly monitor states of some of the storage elements but not to monitor the configuration data.

To select the desired data from the data read back from the device, past practice included creating a mask indicating which bits of the data comprise the desired data. The size of the mask, therefore, was the same as the size of the configuration bitstream. Thus, prior systems had to process and provide storage for a large mask file, which could be larger than 1 MB, for example.

Communication between a host computer and an FPGA typically occurs through a cable that includes electronic devices. For example, the XChecker™ cable available from Xilinx, Inc. includes an FPGA situated in the cable. Also in the XChecker cable is sufficient memory for configuring the destination PLD (not the FPGA in the cable) and verifying this configuration data, since in these modes the data are simply passed through from the host to the PLD or from the PLD to the host. However, the XChecker cable FPGA can also initiate and control readback of selected state data from the destination PLD, applying a readback clock signal to the destination PLD to control reading back of data into the XChecker cable memory, from where it can be read by the host computer.

The continued growth in number of programmable resources and storage elements in programmable logic devices will require additional time for reading back data from a programmable logic device for purposes of testing and debugging designs. Thus, testing designs may become more time-consuming using current techniques, thereby increasing product costs. Special hardware arrangements made to test and debug a circuit implemented on a PLD may also increase product costs. A method that address the aforementioned problems, as well as other related problems, is therefore desirable.

SUMMARY OF THE INVENTION

The invention provides a method and system for testing operation of a circuit implemented on a programmable logic device. In one embodiment, a circuit implemented in a programmable logic device is tested using a host processor coupled via an interface device to the programmable logic device. The interface device includes a plurality of signal pins connected to selected input pins of the programmable logic device for configuring the programmable logic device. Test vectors from the host processor are applied via the interface device to the selected input pins of the programmable logic device, and the states of one or more signals appearing on one or more output pins of the device are analyzed.

In another embodiment, a system is provided. The system comprises a host data processing system coupled to an interface device. During a configuration process the host configures the programmable logic device, and during a test process the host applies input test signals to selected pins of the programmable logic device. The host uses selected pins of the interface device twice, both for functions during configuration and to input test signals during the test process.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which.

Figure 1:
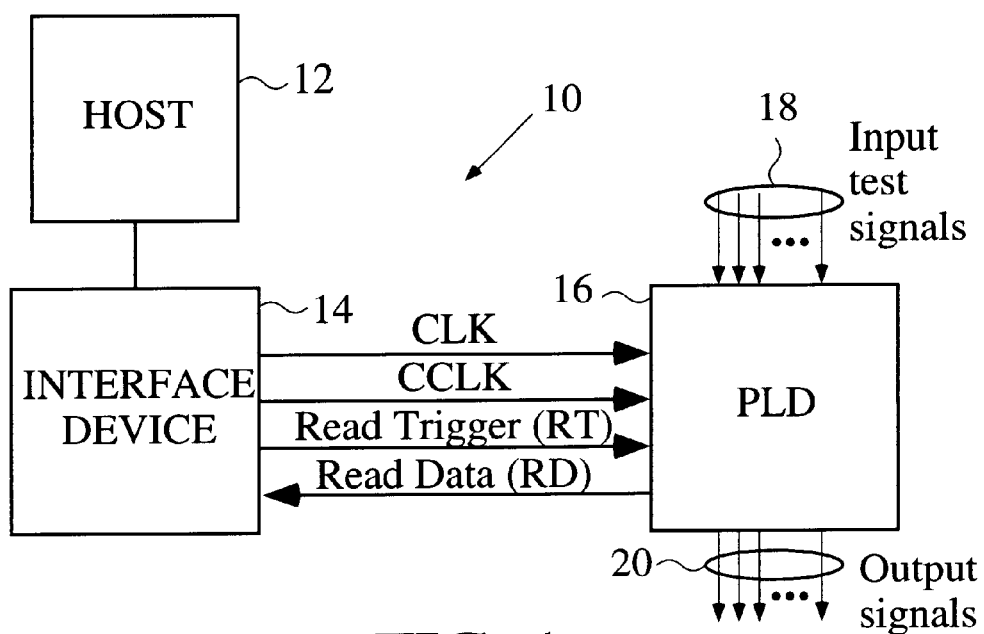
FIG. 1. is a block diagram of a prior art arrangement for configuring and testing a circuit implemented on a PLD.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of methods and systems for testing circuits implemented on programmable logic devices. The present invention has been found to be particularly applicable and beneficial in providing input test signals and reading output signals from a circuit implemented on an PLD. While the present invention is not so limited, an appreciation of the present invention is presented by way of specific examples involving PLDs.

FIG. 1 is a block diagram of a prior art arrangement for configuring and testing a circuit implemented on a PLD. Arrangement 10 includes host data processing system 12 coupled to interface device 14, which is coupled to PLD 16. Configuration and testing of PLD 16 is controlled by software executing on host 12, which is a personal computer or workstation. Hardware debugging software from Xilinx, Inc., provides the configuration and testing capabilities, and the XChecker™ cable, also from Xilinx, is an example of interface device 14.

The process for testing a circuit implemented on PLD 16 with prior art arrangement 10 generally includes configuring PLD 16, stepping the chip clock signal CLK to PLD 16, applying input test signalson input lines 18, and reading back state data (Read Data) from PLD 18. The Read Trigger signal is used to initiate the read-back of data from PLD 16. The configuration and read-back clock signal CCLK controls downloading of the configuration bitstream and reading back of the states of flip-flops and configuration data. External hardware (not shown) supplies the desired input test signals 18. If signals that appear on the output pins of PLD 16 need to be probed as the CLK signal is stepped, then external hardware, for example a logic analyzer needs to be coupled to receive output signals 20. Thus, in order to test the circuit implemented on PLD 16, additional hardware is required for both inputting test signals and receiving output signals. The additional hardware can be costly and reduce flexibility in constructing and running various tests. Further, if a readback needs to be performed after test signals have been applied, and after the chip clock signal CLK has been stepped, the readback step is time consuming if the chip is large.

Figure 2:
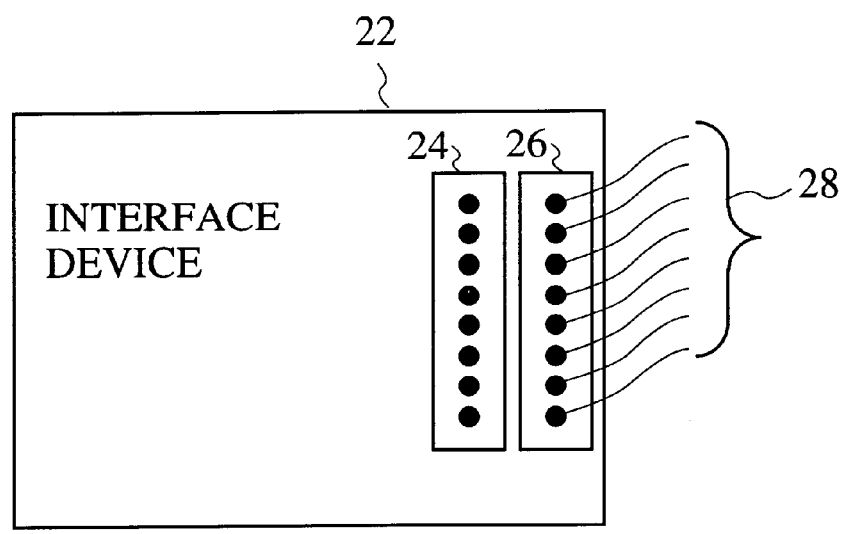
FIG. 2 illustrates a pin configuration for a specific prior art interface device.

FIG. 2 illustrates the pin configuration for a specific prior art interface device 22, for example, the XChecker cable. Interface device 22 includes 2 ports 24, 26, each having 8 pins. The 16 pins of interface device are used for configuration modes and read-back for various PLDs available from Xilinx, for example. Wires 28 are used to connect the pins of interface device 22 to the configuration pins of a PLD in accordance with a desired configuration mode. Selected ones of wires 28 are also connected to a PLD and the pins of interface 22 for reading back data, as illustrated in FIG. 1.

Figure 3:
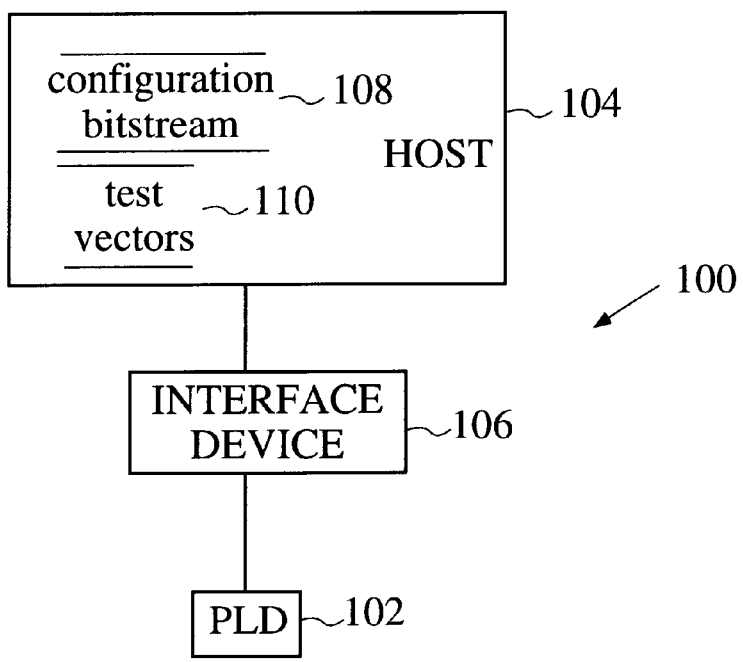
FIG. 3 is a block diagram of an example system for configuring and testing a programmable logic device.

FIG. 3 is a block diagram of an example system 100 for configuring and testing a programmable logic device (PLD) 102. System 100 includes programmable logic device 102, host data processing system 104, and interface device 106. In the example embodiment, host 104 is a conventional workstation or personal computer that is configured to execute hardware debugging software from XILINX, for example. Host 104 is coupled to interface device 106, for example, via a USB or RS232 serial interface. The Multi-LINX™ cable product from XILINX, for example, can be configured in accordance with the present invention and provides the functions of interface device 106. PLD 102 is coupled to interface device 106 via conventional wiring.

According to an example process, a circuit design embodied in configuration bitstream 108 is downloaded to PLD 102. It will be appreciated that configuration bitstream 108 can be constructed using conventional design tools. A user can then select, via hardware debugging software executing on host 104, which signals of the circuit design are to be examined. The signals correspond to states of storage elements, for example flip-flops, in PLD 102.

In a prior art method and arrangement (not shown), the user tests the design on PLD 106 by supplying desired input test signals and advancing the chip clock of PLD 102. The desired input test signals are provided to input pins of PLD 102 from devices that are coupled to PLD 102, for example, where the devices and PLD 102 occupy a circuit board. After advancing the chip clock a desired number of cycles and supplying the desired input signals, the user can examine states of the desired signals by reading back data from PLD 102 to host 104 via interface device 106. The "readback data" is comprised of the configuration bits used to program the programmable resources, such as lookup tables and multiplexers, along with bits from storage elements in the device. It will be appreciated that the states of the storage elements may have changed from the initial states specified in the configuration bitstream, while configuration bits remain unchanged.

While the readback method may be suitable for verification testing, debugging a circuit implemented on PLD 102 while the circuit is active may be difficult since special test circuitry would be required to provide the input test signals to PLD 102 and read the output signals from PLD 102. Furthermore, a read-back of the entire bitstream for large devices can be unnecessarily time-consuming if the intention is simply to probe the states of selected output signals or flip flops.

The present invention eliminates or reduces the need for special test circuitry coupled to PLD 102 by using available signal channels of interface device 106 to provide input test signals to selected pins of PLD 102, and optionally, read output signals from selected pins of PLD 102. The input test signals are specified as test vectors 110, for example, and supplied by software executing on host 104 to PLD 102 via interface device 106.

Figure 4:
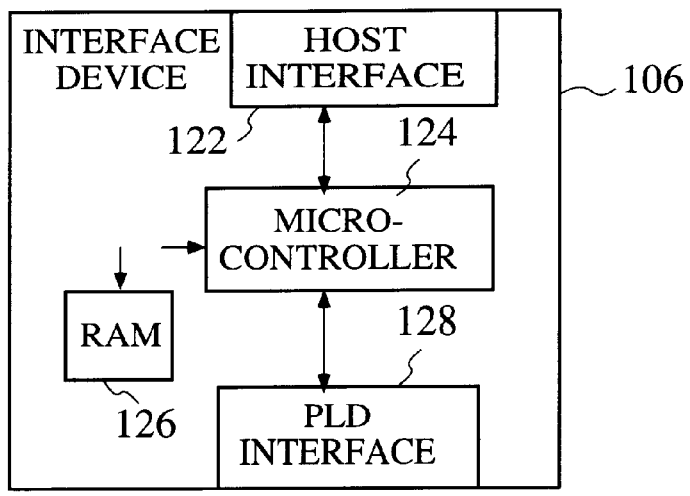
FIG. 4 is a block diagram of an example interface device.

FIG. 4 is a block diagram of an example interface device 106. Interface device 106 includes host interface section 122, microcontroller 124, memory 126, and PLD interface 128. Microcontroller 124 directs operations of interface device 106 in response to control signals issued from host 104. For example, in response to a user instructing hardware debugging software on host 104 to advance the chipclock for PLD 102, microcontroller 124 advances the chip clock to PLD 102 by one cycle.

Memory 126 is coupled to microcontroller 124. Configuration bitstream 108 downloaded from host 104 is temporarily stored by microcontroller 124 in memory 126 prior to downloading the configuration bitstream via PLD interface 128 to PLD 102.

PLD interface 128 is coupled to microcontroller 124. The particular attributes of PLD interface 128 depend on the particular PLD 102. Host interface 122 is also coupled to microcontroller 124 and can be either a USB interface or an RS232 interface, for example. The elements of interface device 106 can be conventional devices connected and arranged in a conventional manner. Those skilled in the art will appreciated that various alternative embodiments would be suitable to implement the present invention.

Figure 5:
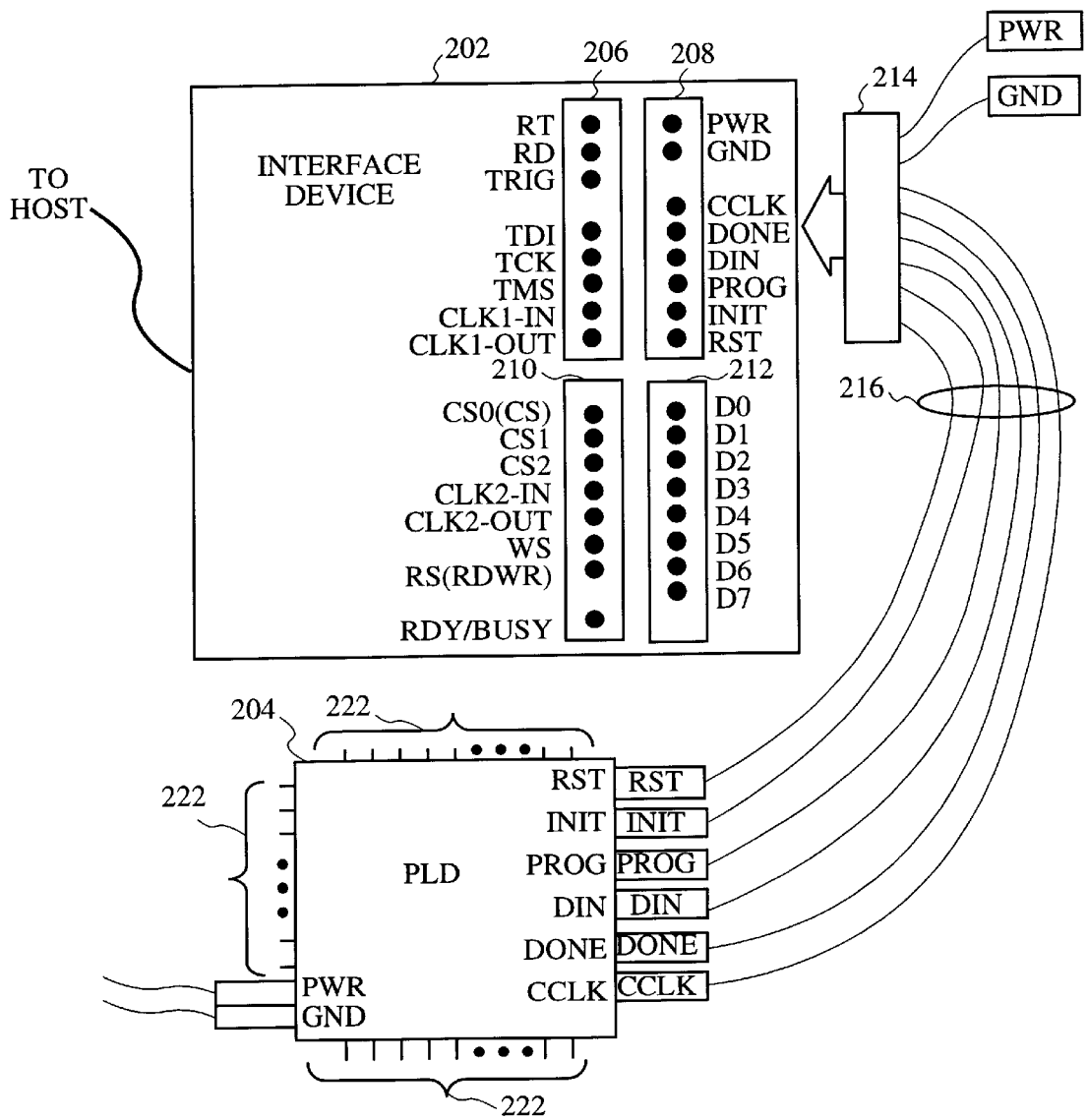
FIG. 5 shows an example interface device 202 arranged for configuring an example PLD.

FIG. 5 shows an example interface device 202 arranged for configuring an example PLD 204. Interface device 202 includes 4 ports 206, 208, 210, and 212, each having 8 pins. The illustrated pin configuration for interface device 202 is that implemented on the MultiLINX™ interface device from Xilinx. It will be appreciated that interface device 202 can be used to configure and test a PLD in the same manner as that described above in FIGS. 1 and 2 for prior art interface devices 16 and 22. In particular, interface device 202 is controlled by host software to apply the CLK signal, readback data from the 204, and extract the bits that correspond to desired signals.

Interface device 202 is arranged to be connected to PLD 204 via connector 214 and wires 216. Connector 214 is shown as being positioned for connection to port 208. The illustrated connections are for a slave serial mode configuration for different families of PLDs from XILNX. It will be appreciated that other types of interface devices and programmable logic devices may use different pins for configuration. Thus, it will be understood that the specific pins shown are for the purpose of illustrating that certain pins of interface device 202 are used specifically for configuration, and as will be explained with FIG. 6, the same pins that are used for configuration during the configuration process can be reconnected to I/O pins of PLD 204 (after the PLD is configured) and used for input/output of signals in testing and debugging a circuit implemented on PLD 204. I/O pins of PLD 204 are indicated with reference number 222.

The names of the pins of interface device 204 and the associated functions are explained in the following paragraphs. Pins on PLD 204 shown as having the same names as pins on interface device 202 have the same functions set forth below.

PWR—supplies power to interface device. It will be appreciated that a separate power supply (not shown) can be connected to the PWR pin of PLD 204 and to the PWR wire of connector 214.

GND—supplies ground reference to interface device 202. It will be appreciated that a common ground reference can be connected to the GND pin of PLD 204 and to the GND wire of connector 214.

CCLK—is the configuration and read-back clock pin.

DONE—represents the D/P pin for Xilinx PLDs and indicates when the configuration process is complete.

DIN—provides configuration data to PLD 204 and is tri-stated at all other times.

PROG—a 300 ns or greater low pulse causes PLD 204 to reprogram.

INIT—indicates the start of configuration for XC3000 and XC4000 PLDs. A logic level 0 on this pin during configuration indicates an error.

RST—during configuration, a low pulse causes XC3000 PLDs to restart configuration. After configuration, this pin can drive low to reset the PLD's internal latches and flip-flops. RST is the active high for XC4000 and XC5200 PLDs.

RT—is the readback trigger for reading back data from PLD 204.

RD—readback data is output from PLD 204 to interface device 202 on this pin.

TRIG—triggers interface device 202 to initiate a readback and causes the RT pin to go high.

TDI, TDO, TCK, TMS—these pins are used for JTAG configuration mode.

The remaining pins (CLK1-IN, CLK1-OUT, D0-D7, RDY, RS, WS, CLK2-OUT, CLK2-IN, CS2, CS1, and CS0) are used for other configuration modes for Xilinx PLDs.

After configuration of PLD 204, testing and/or debugging of the circuit implemented on PLD 204 can commence. In prior, art test and debug arrangements, selected I/O pins of PLD 204 are connected to other devices, for example, via a circuit board, for providing input test signals. Still other I/O pins of PLD 204 are connected to other devices, for example, a logic analyzer, for reading the state of output signals. Thus, in order to test and/or debug the circuit on PLD 204, a special hardware environment was required. With the present invention, the same device that is used for configuration is also used to test and debug the circuit on a PLD.

It will be appreciated that input test signals could be applied to input pins of PLD 204 using external hardware as in the prior art, depending upon test requirements. However, with the present invention, the pins of interface device 202 (other than PWR and GND) can be connected to the I/O pins of PLD 222 for input of test signals and receiving output signals as required by a particular test. Thus, with the present invention external hardware for applying input test signals and receiving output signals can be eliminated to reduce costs.

Figure 6:
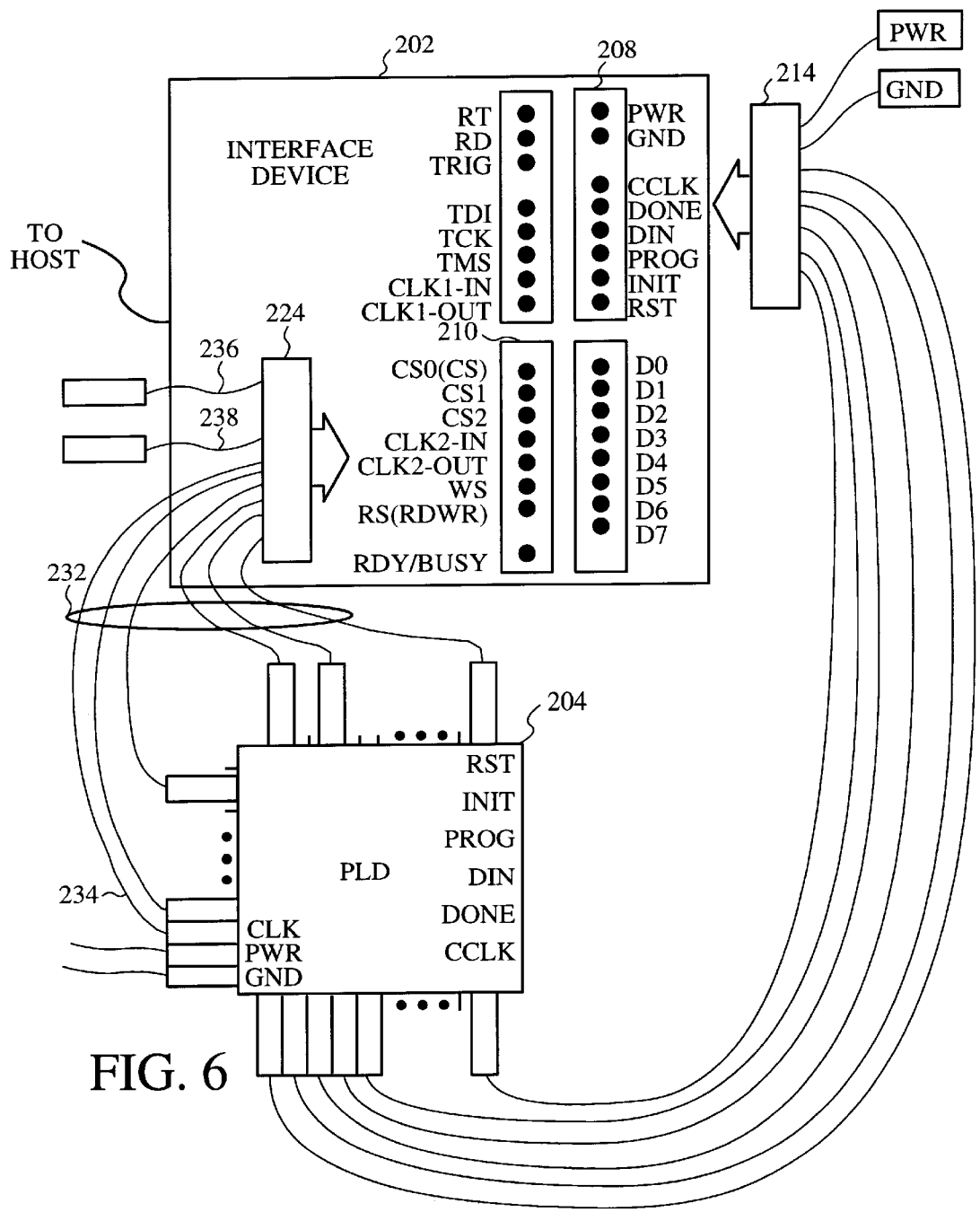
FIG. 6 shows an example connection of an interface device to a PLD for use in testing and debugging a circuit implemented on the PLD.

FIG. 6 shows an example connection of interface device 202 to PLD 204 for use during testing and debugging of a circuit implemented on PLD 204. Note that the same interface device 202 used to configure PLD 204 can be used during testing and debugging. In addition, host 104 can be configured to execute software that provides input test signals to selected input pins of PLD 204 at selected clock intervals and to read signal states from output pins of PLD 204. A user can predefine the state of input test signals with respect to the PLD clock or a strobe signal. Stimulus files of various formats can be constructed using conventional waveform editors or other tools.

The example arrangement has connector 214, connected to the pins of port 208 and connector 224 connected to the pins of port 210. Wires 216 have been reconnected (relative to the connections used for configuration) to I/O pins of PLD 204, and wires 232 of connector 224 have been connected to I/O pins of PLD 204. It will be appreciated that whether a particular wire is connected to an input or and output pin is determined by the particular circuit implemented on PLD 204 and the particular test requirements. Note that wire 234 is connected to an input pin (CLK) of PLD 204 which the circuit uses as a clock input. It will be appreciated that any pin (other than PWR and GND) can be used to connect to the CLK pin of PLD 204. Wires 236 and 238 are not connected to PLD 204 to illustrate that pins of a port of interface device 202 are not required to be used during testing. The unused pins can be connected to a desired voltage level or left to float, for example.

Those skilled in the art will recognize that there are various combinations in which pins of interface device 202 can be connected to I/O pins of PLD 204. For example, selected ones of the pins of interface device 202 could be connected to all output pins of PLD 204, in which case, input test signals to PLD 204 would have to be provided via another device connected to input pins of PLD 204. It will be appreciated that the other device could, for example, be a second interface device.

In another combination of pin connections, selected ones of the pins of interface device 202 could be connected only to input pins of PLD 204. In this combination, another device, for example a logic analyzer could be connected to output pins of PLD 204 for viewing output signal states.

Figure 7:
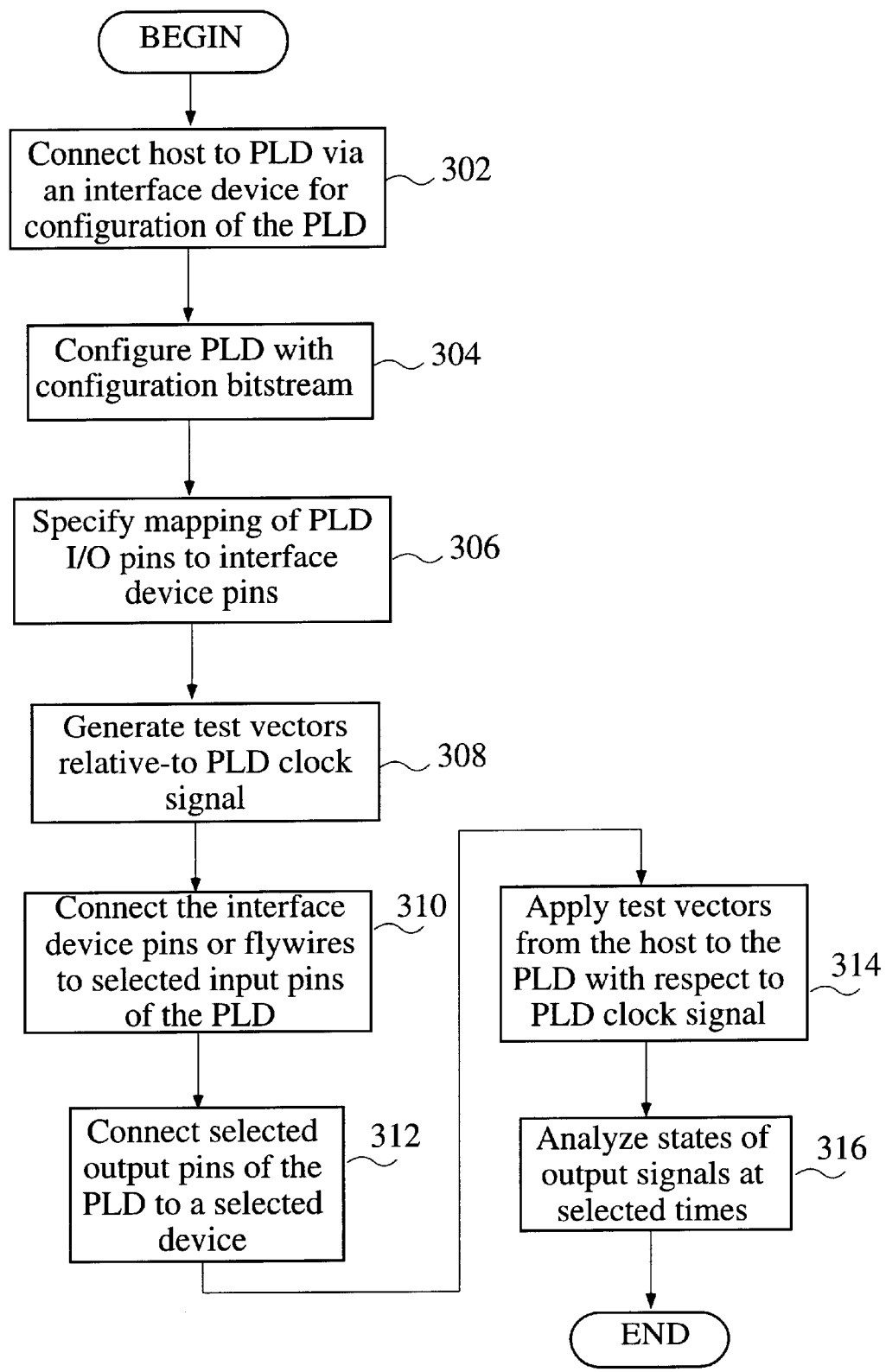
FIG. 7 is a flowchart of a method for testing and/or debugging a circuit implemented on a PLD in accordance with an example embodiment of the invention.

FIG. 7 is a flowchart of a method for testing and/or debugging a circuit implemented on a PLD in accordance with an example embodiment of the invention. The process generally comprises configuring the PLD using an interface device, connecting pins of the interface device to selected I/O pins of the PLD, and applying test input signals to and/or reading states of signals from pins of the PLD via the interface device.

At step 302, the PLD is coupled to a host via an interface device for configuration of the PLD. The host executes conventional software, such as that available from Xilinx, and configures the PLD at step 304. Once configuration of the PLD is complete, testing and/or debugging can commence.

At step 306, selected pins of the interface device are mapped to I/O pins of the PLD. This allows easy reference to signals input to and output from the PLD. For example, if the PLD outputs a signal named SIG1 on I/O pin 43 and I/O pin 43 is connected to the interface device pin WS, the mapping allows waveform viewing of the signal referenced as SIG1 or I/O-43. Whereas, if the mapping was not performed, the signal would be referenced as WS, which is the name of the pin on the interface device. The mapping also aids in constructing test programs to compare the state of signal SIG1 to an expected state by allowing specification of either the logical signal name or the name of the PLD I/O pin.

Test vectors are generated at step 308. The particular test vectors and relative PLD clock intervals at which they are applied are test dependent. It will be appreciated that the test vectors may be applied to the PLD either via the interface device or from other circuitry coupled to the PLD, depending upon test requirements.

At step 310, selected input pins of the PLD are connected to selected pins or fly-wires of the interface device, and at step 312, selected output pins of the PLD are connected to selected pins of the interface device. It will be appreciated that "fly-wires" is the term commonly used to refer to the wires of Xilinx interface devices that are used to connect to a PLD. As explained above, the interface device may be used to supply only input signals, receive only output signals, or a combination thereof. Using the same interface device for both configuration and testing of the PLD reduces the complexity of the arrangement required for testing and also adds flexibility to constructing tests.

At step 314, test vectors are applied to the PLD at the clock intervals specified in the test vectors. Depending on the test configuration, the vectors can be applied either via host software or from external circuitry.

In an example embodiment, software on host 104 controls the test and debug process. Conventional functions for stepping the clock input to PLD are implemented in the host software, and the host software applies input test signals to selected pins of the PLD and reads output signals from the PLD via the interface device. The host software uses the following programming interface calls to accomplish the indicated functions, and the interface device implements the designated functions. The programming interface functions are specified below in the C programming language.

The function to write data to selected port pins of interface device is implemented with the command:

WritePortData (unsigned char port, unsigned char data)

The input parameter port specifies the port of the interface device, and the data parameter indicates the data to write to the selected pins.

The function to enable selected pins of a port is implemented with the command:

SelectPortPins (unsigned char port; unsigned char pinMask)

A bit mask is specified with the pinMask parameter to indicate which pins of the port indicated by the port parameter to enable. A logic level 1 in a position in the pinMask enables the corresponding pin in the port. Data specified in a WritePortData command is only applied to enabled pins of a port of the interface device.

The function to tri-state selected pins of the interface device is implemented with the command:

TriStatePortPins (unsigned char port, unsigned char pinMask)

The port parameter specifies the port and the pinMask parameter is a bit mask that selects the pin(s) to tristate.

The function to read data from selected pins of the interface device is implemented with the command:

ReadPortData (unsigned char port, unsigned char* dataAddr)

The port parameter specifies the port and the dataAddr is the address of host 104 in which the data is to be stored. It will be appreciated that the signal states of all pins of a port are returned to host 104 with this command.

At step 316 states of the output signals are analyzed at selected intervals of the PLD clock. In analyzing states of output signals, it will be appreciated that in one embodiment the signal can be analyzed by viewing the signal with convention waveform viewing systems, and in another embodiment, the signal state can be compared to an expected state for the chosen clock interval. In addition, depending on the test/debug requirements, some output pins of the PLD can be connected to the interface device and some other output pins can be connected to a logic analyzer.

Figure 8A:
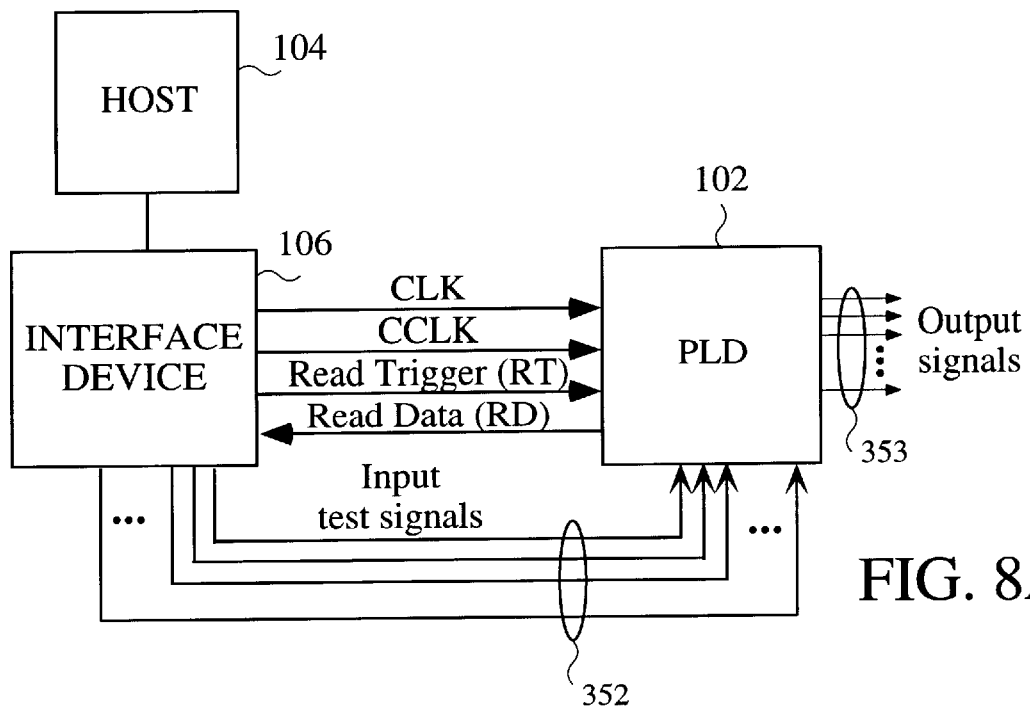
FIGS. 8A–8D are block diagrams that illustrate different arrangements for testing a circuit implemented on a PLD in accordance with various embodiments of the present invention.

FIGS. 8A–8D are block diagrams that illustrate different arrangements for testing a circuit implemented on a PLD in accordance with various embodiments of the present invention. In FIG. 8A, interface device 106 is coupled to PLD 102 in a manner similar to that explained in FIG. 1 with respect to the CLK, CCLK, RT, and RD signals. In addition, a set of input test signals 352 is applied to input pins of PLD from interface device 106. Depending upon the desired test, the CLK signal may be supplied from interface device 106 to PLD 102 via the CLK1-OUT or CLK2-OUT pins of interface device 106 (See FIG. 5). Output signals 353 from PLD 102 may be probed with a logic analyzer or oscilloscope, for example.

Figure 8B:
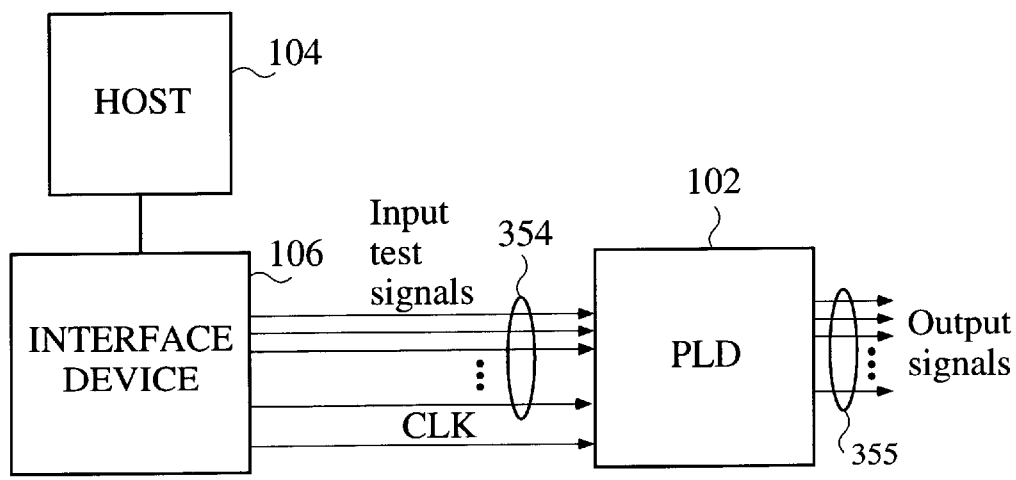

In FIG. 8B, the arrangement illustrates a scenario in which a user is not interested in the internal signal states and is only interested in providing input test signals to PLD and observing output signals 355 with an external device. Thus, input test signals 354 can be applied via the CLK, CCLK, RT, and RD pins (as well as others) of interface device 106. Recall that the CCLK, RT, and RD pins of interface device 106 were used for readback in the arrangement of FIG. 8A.

Figure 8C:
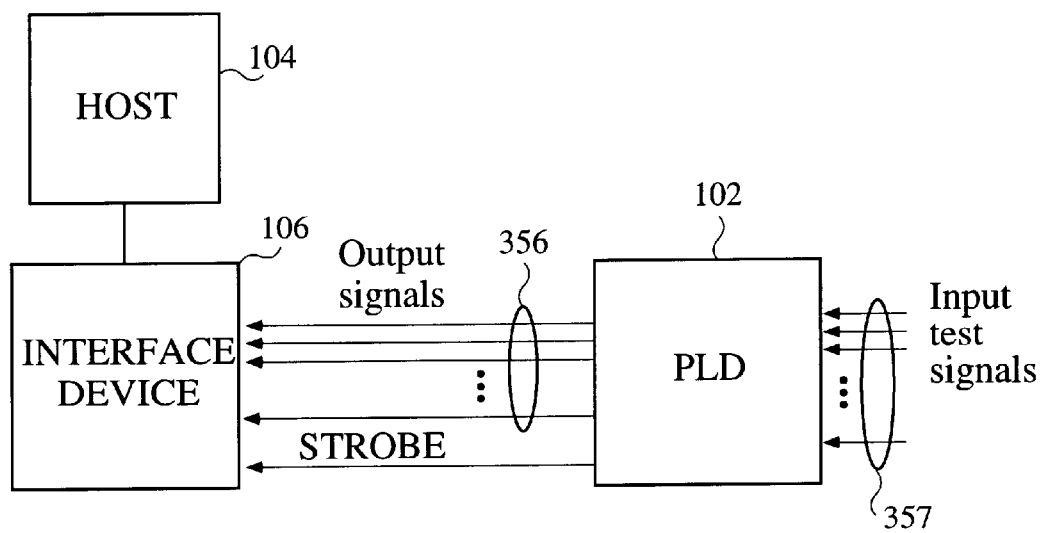

In FIG. 8C, a user can use interface device 106 to gather output signals from PLD 102 rather than using costly logic analyzers or oscilloscopes to view the outputs. In this arrangement, interface device 106 is used for reading output signals 356 from PLD 102 and not for applying input test signals 357. As configured by commands from host 104, interface device 106 reads the states of pins at defined STROBE points. Software executing on host 104 displays the signals as waveforms, which can be compared against expected states. In an example embodiment, the RT pin of interface device 106 could be used to receive the strobe input from PLD 102, and the states of the output signals are stored in RAM 126.

Figure 8D:
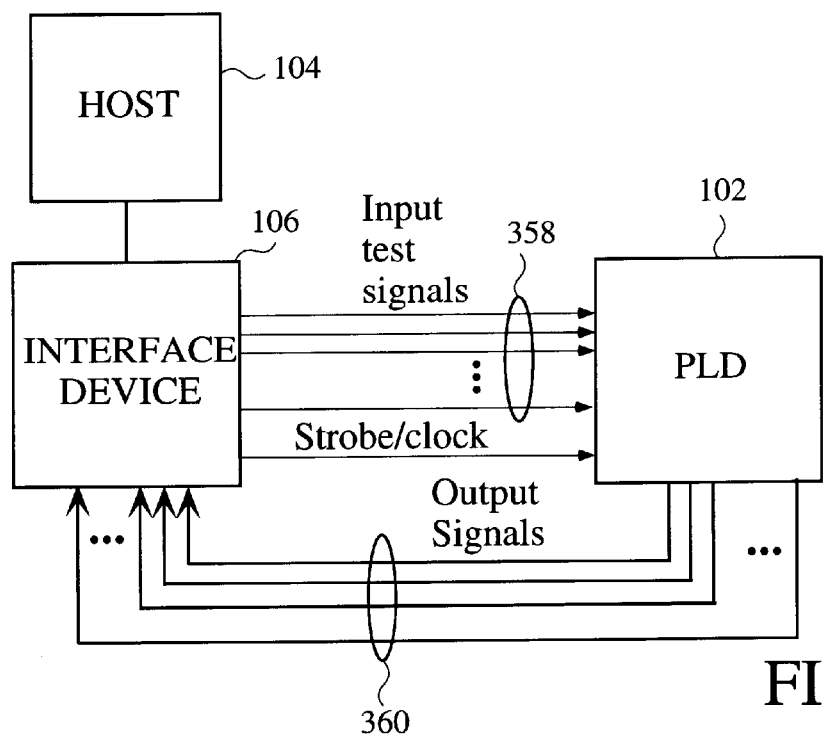

Interface device 106 cab be used both for providing input test signals 258 to and for receiving output signals 360 from PLD 102, as shown in FIG. 8D. Input signals 358 can be applied prior to application of a single step clock signal, and outputs can be read after application of the clock signal.

Accordingly, the present invention provides, among other aspects, a system and method for testing operation of a circuit implemented on a PLD using an interface device for both configuration and input and/or output of signals to I/O pins of the PLD. Other aspects and embodiments of the presents invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for testing a circuit implemented on a programmable logic device using a host processor coupled to the programmable logic device via an interface device containing at least one electronic device, the interface device having a plurality of signal pins for configuring the programmable logic device, comprising:

connecting selected pins of the interface device containing at least one electronic device to selected input pins of the programmable logic device;

applying test vectors from the host processor to the selected input pins of the programmable logic device via the interface device containing at least one electronic device, each test vector including one or more signal states to be applied to the programmable logic device; and analyzing states of signals appearing on output pins of the programmable logic device.

2. The method of claim 1 wherein the step of analyzing states of signals appearing on output pins of the programmable logic device comprises comparing signals on the output pins to expected output signals.

3. The method of claim 1, further comprising:

connecting selected pins of the interface device to associated configuration pins of the programmable logic device; and configuring the programmable logic device with a circuit design downloaded from the host processor to the programmable logic device via the interface device.

4. The method of claim 1, further comprising reading signal states from selected output pins of the programmable logic device to the host processor via the interface device.

5. The method of claim 1, wherein a logic analyzer is connected to one or more output pins of the programmable logic device, and further comprising viewing the signal states on the one or more output pins of the programmable logic device.

6. The method of claim 1, further comprising issuing from a test program executing on the host processor a programming interface write command having the test vector and a specification of the pins on which to apply the test vector.

7. The method of claim 6, wherein the interface device includes a plurality of ports, each port including a plurality of pins, and further comprising specifying in the write command the port having the pins on which the test vector is to be applied.

8. The method of claim 7, further comprising issuing from the test program a programming interface select-port-pins command having a port identifier and a bit-mask for enabling writing of data to specified pins of a specified port.

9. The method of claim 1, further comprising issuing from a test program executing on the host processor a programming interface read command having a specification of pins from which to read output signals.

10. The method of claim 6, wherein the interface device includes a plurality of ports, each port including a plurality of pins, and further comprising specifying in the read command the port having the pins on which the signals are to be read.

11. A system for testing a circuit implemented on a programmable logic device having input and output pins, comprising:

a host data processing system configured and arranged to configure the programmable logic device during a configuration process, and to apply input test signals to selected pins of the programmable logic device during a test process;

an interface device comprising a microcontroller and a RAM, the interface device having pins arranged to be connected to the programmable logic device, wherein selected pins of the interface device are used by the host for predetermined functions during configuration and for test signals during the test process.

12. The system of claim 11, wherein the host is further configured and arranged to read signals output from the programmable logic device via selected pins of the interface device.

13. The system of claim 12, wherein the interface device includes a plurality of ports, each having a respective plurality of pins.

14. The system of claim 13, wherein the host is further configured and arranged to issue a write command to the interface device which specifies the port and states of signals to apply to pins of the port.

15. The system of claim 14, wherein the host is further configured and arranged to issue a read command to the interface device which specifies the port and pins of the port from which states of signals are obtained.

16. A system for testing a circuit implemented on a programmable logic device having input and output pins, comprising:

a host data processing system configured and arranged to configure the programmable logic device during a configuration process, and to apply input test signals to selected pins of the programmable logic device during a test process;

an interface device having pins arranged to be connected to the programmable logic device, the interface device including electronic circuits to drive signals to the programmable logic device during configuration of the programmable logic device, and electronic circuits to receive signals from the programmable logic device during testing of the programmable logic device.

* * * * *